(12) United States Patent
Wiesa

(10) Patent No.: US 10,117,323 B2
(45) Date of Patent: Oct. 30, 2018

(54) CIRCUIT BOARD WITH A HEAT-CONDUCTING ELEMENT

(71) Applicant: Robert Bosch GmbH, Stuttgart (DE)

(72) Inventor: Thomas Wiesa, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/503,976

(22) PCT Filed: Jun. 23, 2015

(86) PCT No.: PCT/EP2015/064027
§ 371 (c)(1),
(2) Date: Feb. 14, 2017

(87) PCT Pub. No.: WO2016/023663
PCT Pub. Date: Feb. 18, 2016

(65) Prior Publication Data
US 2017/0280552 A1    Sep. 28, 2017

(30) Foreign Application Priority Data
Aug. 14, 2014 (DE) .................. 10 2014 216 194

(51) Int. Cl.
*H05K 1/02* (2006.01)
*H05K 1/18* (2006.01)
*H01L 23/367* (2006.01)

(52) U.S. Cl.
CPC ......... *H05K 1/0204* (2013.01); *H01L 23/367* (2013.01); *H05K 1/021* (2013.01);
(Continued)

(58) Field of Classification Search
CPC .. H05K 1/0204; H05K 1/0271; H05K 1/0209; H05K 1/0206; H01L 23/367
See application file for complete search history.

(56) References Cited

U.S. PATENT DOCUMENTS 5,050,040 A  *  9/1991  Gondusky ............. H01L 23/142
                                                              165/185
5,113,315 A      5/1992  Capp et al.
(Continued)

FOREIGN PATENT DOCUMENTS

DE    102005047025    4/2007
DE    102007037297    2/2009
(Continued)

OTHER PUBLICATIONS

International Search Report for Application No. PCT/EP2015/064027 dated Oct. 20, 2015 (English Translation, 3 pages).
(Continued)

*Primary Examiner* — Ishwarbhai B Patel
(74) *Attorney, Agent, or Firm* — Michael Best & Friedrich LLP

(57) ABSTRACT

The arrangement relates to a circuit board having at least one electrically insulating layer and at least one electrically conductive layer. The circuit board has at least one heat-conducting element which is embedded in the electrically insulating layer and which is of thermally conductive form. The heat-conducting element is designed to transport heat losses transversely with respect to an areal extent of the circuit board. According to the arrangement, the heat-conducting element has at least two sub-elements formed in each case by a metal body. The heat-conducting element has an electrically insulating connecting layer which is arranged between the sub-elements and which is designed to electrically insulate the sub-elements with respect to one another and connect the sub-elements to one another in thermally conductive fashion.

12 Claims, 3 Drawing Sheets

(52) U.S. Cl.
CPC ......... *H05K 1/0206* (2013.01); *H05K 1/0209* (2013.01); *H05K 1/0271* (2013.01); *H05K 1/181* (2013.01); *H05K 2201/066* (2013.01); *H05K 2201/09063* (2013.01)

(56) References Cited

U.S. PATENT DOCUMENTS

| | | | | |
|---|---|---|---|---|
| 5,731,067 | A * | 3/1998 | Asai | H01L 23/3677 174/252 |
| 6,156,980 | A * | 12/2000 | Peugh | H01L 23/3677 174/252 |
| 6,449,158 | B1 * | 9/2002 | Wang | H01L 23/3735 165/185 |
| 6,727,585 | B2 * | 4/2004 | Choi | H01L 23/49562 257/706 |
| 8,237,260 | B2 * | 8/2012 | Tschirbs | H01L 23/13 257/684 |
| 8,330,051 | B2 | 12/2012 | Huang et al. | |
| 8,410,371 | B2 * | 4/2013 | Andrews | H01L 23/3677 174/252 |
| 8,488,316 | B2 * | 7/2013 | Zeng | H02M 7/003 257/666 |
| 8,730,674 | B2 * | 5/2014 | Dede | F25B 21/00 165/80.4 |
| 2002/0038908 | A1 * | 4/2002 | Ding | H01L 23/3128 257/720 |
| 2009/0040727 | A1 | 2/2009 | Decker | |
| 2009/0052146 | A1 | 2/2009 | Busch et al. | |
| 2010/0200277 | A1 * | 8/2010 | Huang | H05K 1/0204 174/252 |
| 2012/0279760 | A1 * | 11/2012 | Sun | H01L 33/642 174/252 |
| 2013/0025839 | A1 | 1/2013 | Egitto et al. | |
| 2013/0039013 | A1 | 2/2013 | Waegli et al. | |
| 2014/0048313 | A1 | 2/2014 | Pan et al. | |
| 2014/0144677 | A1 * | 5/2014 | Wang | H05K 1/0206 174/252 |
| 2014/0182898 | A1 | 7/2014 | Lassman et al. | |
| 2014/0347821 | A1 | 11/2014 | Bendani et al. | |

FOREIGN PATENT DOCUMENTS

| | | |
|---|---|---|
| DE | 102011077206 | 12/2012 |
| DE | 102011090002 | 2/2013 |
| DE | 102013220951 | 6/2014 |
| EP | 1276357 | 1/2003 |
| FR | 2984679 | 6/2013 |
| JP | 2005051088 | 2/2005 |
| WO | 2013068055 | 5/2013 |

OTHER PUBLICATIONS

Pforzheim, B., et al., "Main Aspects in designing DCB subtrates for automotive applications," DVS Berichte, DVS Verlag, Duesseldorf, DE, Feb. 20, 1990-Feb. 22, 1990, pp. 25-29 (English Abstract).

* cited by examiner

CIRCUIT BOARD WITH A HEAT-CONDUCTING ELEMENT

BACKGROUND OF THE INVENTION

The invention relates to a circuit carrier, in particular one that is planar, with at least one, in particular fiber-reinforced, electrically insulating layer and at least one electrically conductive layer. The circuit carrier has at least one thermally conductive element, designed to conduct heat, that is positioned within the electrically insulating layer, in particular at least partially or completely embedded therein. The thermally conductive element is designed to transport excess heat transversely to a planar extent of the circuit carrier. The circuit carrier, designed to be planar, has a widthwise extent that is greater than a thickness-wise extent of the circuit carrier transverse to the widthwise extent thereof.

SUMMARY OF THE INVENTION

According to the invention, the thermally conductive element has at least two sub-elements that are each formed from a metal body. Preferably, the thermally conductive element has a connecting layer that is designed to be electrically insulating. The connecting layer is positioned between the sub-elements and is designed to electrically insulate the sub-elements from one another and to connect the sub-elements to one another in a thermally conductive manner.

Heat, in particular excess heat, may thereby advantageously flow from one sub-element to the other sub-element, the sub-elements advantageously being electrically insulated from one another. In this way a connecting arrangement, for example, may be formed, wherein a component that generates excess heat, for example a semiconductor component, is connected to the circuit carrier, the semiconductor component being positioned in the region of the thermally conductive element. The thermally conductive element may, via a sub-element, advantageously absorb the excess heat generated by the semiconductor component and relay it to the additional sub-element via the connecting layer. The excess heat may then advantageously be transferred from the additional sub-element to a cooling element, which is connected to the additional sub-element in a thermally conductive manner. The thermally conductive connection between the additional sub-element and the cooling element is preferably a cohesive connection formed from metal. In this way the semiconductor component, which is connected to the aforementioned sub-element electrically and in a thermally conductive manner, may advantageously be electrically insulated from the heat sink, in particular from the cooling element.

Preferably, the thermally conductive element has an areal heat capacity that is higher than that of the electrically conductive layer, in particular the interconnect of the circuit carrier, with respect to a planar extent of the circuit carrier. The excess heat may thereby advantageously be guided though the circuit carrier along its thickness-wise extent that is transverse to the planar extent. Preferably, the thermally conductive element additionally has a thickness-wise extent that is greater than that of the electrically conductive layer.

The circuit carrier is preferably designed to be planar. It is additionally preferable for the circuit carrier to have a widthwise or lengthwise extent that is greater than a thickness-wise extent.

The connecting layer of the thermally conductive element preferably extends in a coplanar manner to the circuit carrier. In this way the thermally conductive element may advantageously electrically insulate the heat conduction pathway through the circuit carrier.

In one preferred embodiment, the sub-elements are each formed from a block of copper. In this way the thermally conductive element may advantageously exhibit high thermal conductivity, which in the case of copper is at least 250 watts per meter kelvin, and 400 watts per meter kelvin in the case of electrolytic copper.

In another embodiment, the sub-element is formed from silver. In this way the circuit carrier may advantageously exhibit good thermal conductivity and thus greater power density, and advantageously also be of compact construction.

In one preferred embodiment, the thickness dimension of the thermally conductive element, in particular of the sub-element, is greater than that of the electrically conductive layer. The electrically conductive layer is preferably bonded to the electrically insulating layer, for example a fiber-reinforced epoxy resin layer created from a prepreg, by means of lamination.

In this way the thermally conductive element may have an areal heat capacity that is higher than that of the electrically conductive layer, in each case with respect to a surface of the circuit carrier along its planar extent.

In one preferred embodiment, the connecting layer is designed to be adhesive. It is additionally preferable for the connecting layer to have an adhesive and it is preferably designed to be self-adhesive. The connecting layer preferably comprises a plastic layer, with additional preference a polyamide layer or polyimide layer, which may, for example, be formed from a film. The plastic layer preferably forms a carrier layer which is bonded to at least one, preferably two, adhesive layers. Preferably, the two adhesive layers include the plastic layer between them. The plastic layer may thereby advantageously be adhesively bonded to the sub-element via one of the two adhesive layers and be adhesively bonded to the other of the two sub-elements via the second adhesive layer. The adhesive layer is preferably formed from a dispersion adhesive, in particular an acrylic adhesive. In another embodiment, the adhesive layer is formed from a layer of resin. The plastic layer may, for example, be adhesively bonded to the sub-elements under the effect of pressure and temperature. The resin is, for example, epoxy resin.

The connecting layer is, for example, formed from a PSA (pressure-sensitive adhesive). The thermally conductive element may thus advantageously be provided at low cost.

The thermally conductive element may thus advantageously be formed from an insert part. The insert part may thus advantageously be created at low cost, preferably as an insert part produced separately from the circuit carrier. The sub-elements may advantageously be adhesively bonded to one another before insertion of the thermally conductive element into a recess, corresponding to the thermally conductive element, in the circuit carrier and thus be inserted into the recess as sub-elements adhesively bonded together.

In one preferred embodiment, the connecting layer is a ceramic layer. The ceramic layer preferably comprises aluminum oxide, beryllium oxide, silicon carbide, boron carbide or boron nitride.

Preferably, the thermally conductive layer is advantageously formed from a DBM (direct-bonded metal) substrate, in particular a DBC (direct-bonded copper) substrate. The bond between the sub-element and the connecting layer that is formed from ceramic is preferably a eutectic bond.

The sub-elements may thus advantageously be cohesively connected to the connecting layer.

Both sub-elements are, for example, formed from copper or aluminum, or one sub-element is formed from copper and the other is formed from aluminum.

The aforementioned eutectic bond may, for example, be created by oxidizing the sub-elements, in particular copper or aluminum elements, on one side and, with the metal oxide layer created in this way, pressing them against the connecting layer, in particular a ceramic layer. During the pressing process, the connecting layer, in particular a ceramic layer, and the at least one sub-element are heated to at least 1000 degrees Celsius. This may advantageously result in a thermally conductive element being created that advantageously exhibits high strength and, also advantageously, is able to withstand a large number of alternating temperature loads without delaminating.

In one preferred embodiment, the thermally conductive element is an HTCC (high-temperature co-fired ceramic) substrate. In this way the thermally conductive element may advantageously be formed with high thermal conductivity in addition to good electrical insulation properties.

In another, advantageous embodiment, the thermally conductive element is formed from an AMB (active-metal-brazed) substrate. The AMB substrate preferably comprises at least one copper layer and at least one ceramic layer, in particular aluminum oxide, silicon nitride, aluminum nitride or beryllium oxide. In this way the thermally conductive element may advantageously exhibit high thermal conductivity. The ceramic layer of the AMB substrate is brazed to the copper layer by means of a solder paste.

In one preferred embodiment, the circuit carrier has at least one additional electrically insulating layer, wherein at least one electrically conductive layer of the circuit carrier and the thermally conductive element include the additional electrically insulating layer between them. The thermally conductive element is connected to the electrically conductive layer in a thermally conductive manner by means of at least one thermally conductive metal bridge that passes through the additional electrically insulating layer. The thermally conductive metal bridge is preferably formed from a via, in particular a galvanically formed via. In this way the circuit carrier may advantageously be formed by means of lamination from multiple prepreg layers. The aforementioned electrically conductive layer, which is connected, in particular cohesively connected, to the thermally conductive element, in particular to a sub-element of the thermally conductive element, by means of the metal bridge, preferably extends parallel to a surface of the thermally conductive element facing the electrically conductive layer.

In one preferred embodiment of the circuit carrier, the metal bridge is formed from a via, in particular a galvanically formed via. In another embodiment, the via is created by thermal spraying, in particular plasma spraying, or HVOF (high-velocity oxy-fuel) spraying. In this way the metal bridge may advantageously be positioned in an opening formed in the electrically insulating layer.

In one advantageous embodiment, the electrically conductive layer has a slot or opening for the thermally conductive element. The thermally conductive element advantageously passes through the electrically conductive layer and extends up to a surface of the electrically conductive layer. In this way the circuit carrier advantageously requires no aforementioned metal bridge designed to connect the thermally conductive element, in particular at least one sub-element of the thermally conductive element, to the electrically conductive layer in a thermally conductive manner.

In one preferred embodiment of the circuit carrier, the connecting layer is formed from a thermally conductive adhesive. The thermally conductive adhesive preferably has an adhesive matrix formed from epoxy resin or a silicone elastomer. It is additionally preferable for the thermally conductive adhesive to contain particles, in particular particles of ceramic. The ceramic particles are preferably particles of boron nitride, of aluminum oxide or of boron carbide. In this way the thermally conductive element may advantageously be produced at low cost.

The invention also relates to a connecting arrangement, comprising a circuit carrier of the type described above. The connecting arrangement has at least one semiconductor component that is connected to the electrically conductive layer, it additionally being preferable for the connecting arrangement to have a heat sink, in particular a cooling element or a heat-spreading element. The circuit carrier is connected, in a thermally conductive manner, to the cooling element on a side of the circuit carrier that is facing away from the semiconductor component. In this way the excess heat may advantageously be transported away from the semiconductor component, in particular a power semiconductor component, to the heat sink, formed from the cooling element, the semiconductor component being electrically insulated from the cooling element. The semiconductor component and the cooling element are each connected, for example soldered, to the circuit carrier, and positioned on opposite sides of the circuit carrier to one another.

The invention also relates to a method for guiding excess heat away from a semiconductor component through a circuit carrier, in particular through a circuit carrier of the type described above, to a heat sink, in particular to a cooling element. In the method, the excess heat is guided away from the semiconductor component to an electrically conductive layer connected, in particular soldered, to the semiconductor component. In addition, the excess heat passes, in particular, via at least one thermally conductive metal bridge through at least one electrically insulating layer and is guided to a thermally conductive element which is embedded in the at least one electrically insulating layer and which is cohesively connected to the metal bridge. In addition, the excess heat is transferred from the thermally conductive element to an additional electrically conductive layer via at least one additional metal bridge and from there to the heat sink, in particular to a cooling element.

Preferably, the thermally conductive element has at least two sub-elements, each formed from a metal body and connected to one another via an electrically insulating connecting layer, wherein one sub-element is connected to the metal bridge and the other sub-element of the two sub-elements is connected to the additional metal bridge in a thermally conductive manner, so that the excess heat may flow from the semiconductor component to the cooling element through the connecting layer.

BRIEF DESCRIPTION OF THE DRAWINGS

The invention will now be explained below with reference to figures and further exemplary embodiments. Further advantageous embodiments may be obtained from the features described in the figures and in the dependent claims.

DETAILED DESCRIPTION

Figure 1:
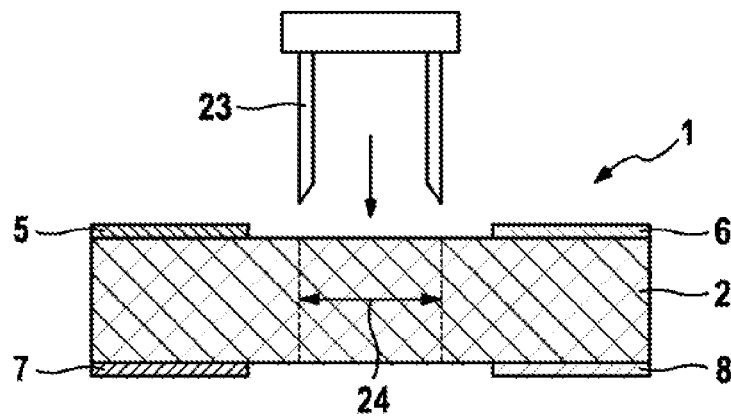
FIG. 1 shows one exemplary embodiment of a step in the method for producing a circuit carrier formed from multiple layers, wherein an opening is punched into the circuit carrier.

FIG. 1 shows one exemplary embodiment of a step in the method for producing a circuit carrier formed from multiple layers. In the method step shown in FIG. 1, a recess or opening is made, using a punching tool 23 or a drilling tool (not shown in FIG. 1), in a portion of the circuit carrier, which circuit carrier comprises an electrically insulating layer 2, on a surface region 24 that is smaller than a surface region of the electrically insulating layer 2.

In the example shown in FIG. 1, the electrically insulating layer 2 is bonded to additional electrically conductive layers 5, 6, 7 and 8, and thus forms a core of a circuit carrier formed from multiple layers.

Figure 2:
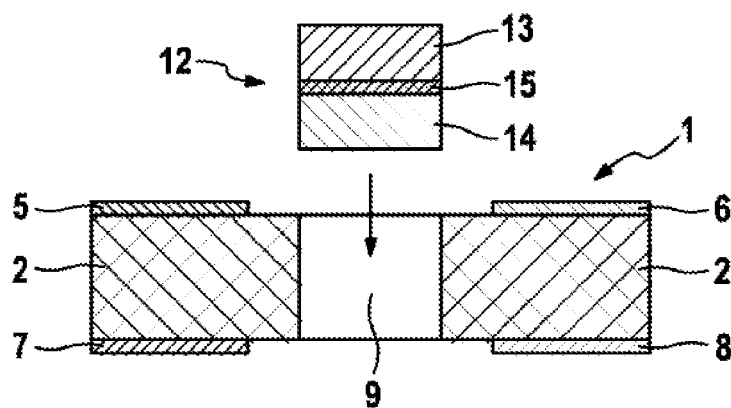
FIG. 2 shows the circuit carrier shown in FIG. 1, wherein, in an additional method step, a thermally conductive element is inserted into the opening.

FIG. 2 shows a method step wherein a thermally conductive element 12 is inserted into the opening 9 previously made in the method step shown in FIG. 1. The thermally conductive element 12 has two sub-elements 13 and 14, each being connected to one another, in a thermally conductive manner, by means of a connecting layer 15 and electrically insulated from one another.

Figure 3:
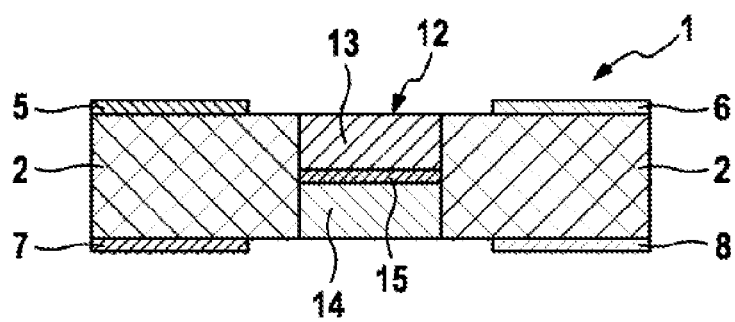
FIG. 3 shows the circuit carrier produced in FIG. 2, comprising the thermally conductive element.

FIG. 3 shows the portion of the circuit carrier shown in FIGS. 1 and 2, wherein the thermally conductive element 12 is inserted into the opening 9 represented in FIG. 2.

Figure 4:
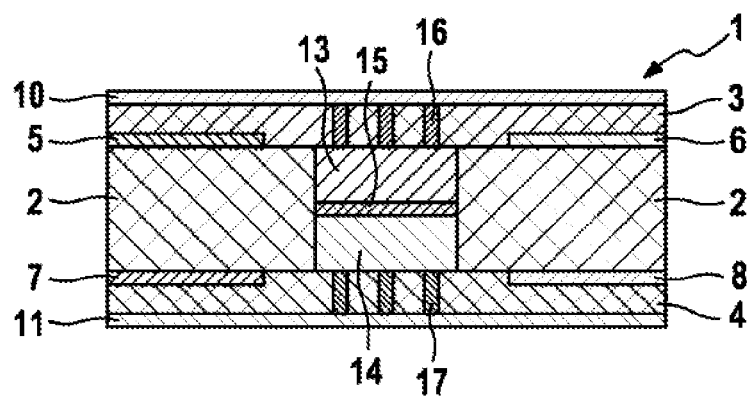
FIG. 4 shows the circuit carrier represented in FIG. 3, wherein the thermally conductive element is connected to an electrically conductive layer of the circuit carrier via metal bridges that pass through an electrically insulating layer.

FIG. 4 shows the circuit carrier 1. The circuit carrier 1 has, in an additional method step, an electrically insulating layer 3 that is laminated onto the portion of the circuit carrier shown in FIG. 3. In addition, at least one via, three vias in this exemplary embodiment, are produced in the electrically insulating layer 3, one via 16 of which is referenced by way of example. In this exemplary embodiment the vias are each formed from a metal bridge, in particular a metal bridge taking the form of a cylinder.

The circuit carrier 1 shown in FIG. 4 also has an electrically conductive layer 10, which is laminated onto the electrically insulating layer 3. The vias, such as the via 16, are each designed to connect the electrically conductive layer 10 and the sub-element 13 of the thermally conductive element 12 to one another both electrically and in a thermally conductive manner.

On a side of the electrically insulating layer 2 that is facing away from the electrically insulating layer 3, an electrically insulating layer 4 is bonded to the electrically insulating layer 2 by means of lamination. At least one via, three vias in this exemplary embodiment, are produced in the electrically insulating layer 4, one via 17 of which is referenced by way of example. The vias, such as the via 17, are each formed from a metal bridge, for example a metal bridge produced by electroplating or thermal spraying. The vias, such as the via 17, are connected to the sub-element 14 electrically and in a thermally conductive manner. The vias, such as the via 17, are connected to an electrically conductive layer 11, which is bonded to the electrically insulating layer 4.

The electrically conductive layers 10 and 11 are thus each connected to a sub-element of the thermally conductive element 12 in a thermally conductive manner and electrically insulated from one another. Thus, with the circuit carrier 4, a semiconductor component may be soldered onto the electrically conductive layer 10 and a cooling element, serving as a heat sink, may be soldered onto the electrically conductive layer 11.

Figure 5:
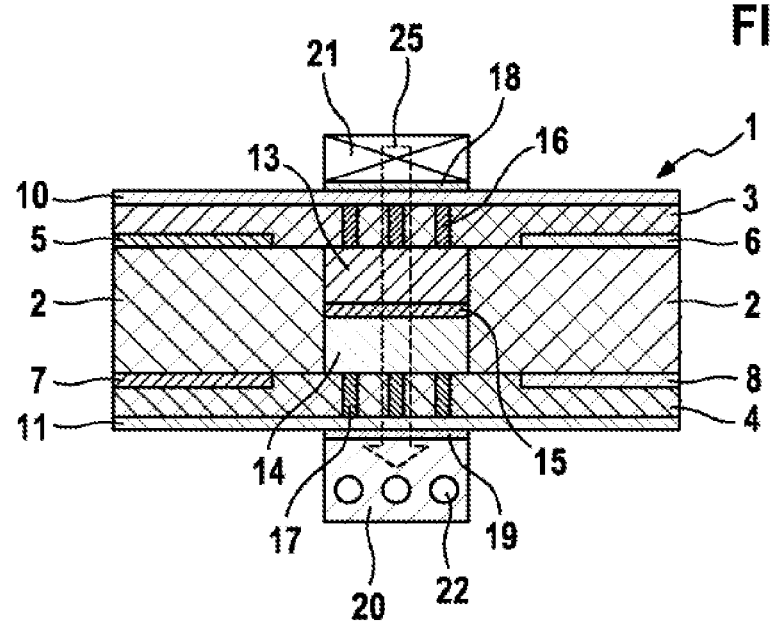
FIG. 5 shows a connecting arrangement comprising the circuit carrier shown in FIG. 4, wherein the circuit carrier is connected to a heat sink and to a semiconductor component.

FIG. 5 shows a connecting arrangement in which the circuit carrier 1 is soldered to a semiconductor component 21 and to a heat sink, formed from a cooling element 20. The electrically conductive layer previously shown in FIG. 4 is bonded to the semiconductor component 21 by means of a layer of solder 18. The semiconductor component 21 is, for example, formed from a diode or a semiconductor switch, in particular a field-effect transistor. The semiconductor switch is, for example, formed from an unpackaged semiconductor switch, also referred to as bare die, or from a packaged semiconductor switch.

The cooling element 20 is, in this exemplary embodiment, formed from a block of copper. Fluid channels are formed in the copper block, one fluid channel 22 of which is referenced by way of example. The cooling element 20 is, in this exemplary embodiment, bonded to the electrically conductive layer 11 by means of a layer of solder 19. The cooling element 20 is positioned opposite the semiconductor component 21 on the circuit carrier 1, so that excess heat 25 generated by the semiconductor component 21 may flow from the semiconductor component 21, through the layer of solder 18, the electrically conductive layer 10 and the vias, such as the via 16, to the sub-element 13 of the thermally conductive element 12. In addition, the excess heat 25 may flow through the connecting layer 15 to the sub-element 14 and from there through the vias, such as the via 17, to the electrically conductive layer 11, and from there onward through the layer of solder 19 to the cooling element 20, serving as a heat sink. The excess heat may be guided away by a cooling fluid, for example cooling water, guided in the fluid channels, such as the fluid channel 22, of the cooling element 20.

The cooling element 20 may, instead of having the fluid channels, have cooling fins designed to dissipate the excess heat 25 by means of convection.

Figure 6:
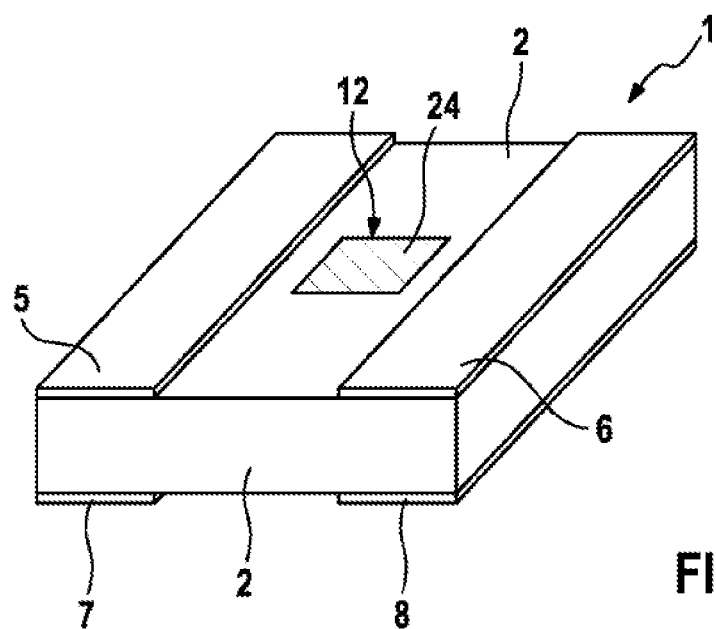
FIG. 6 shows a top view of the circuit carrier represented in FIG. 4.

FIG. 6 shows a top view of the circuit carrier 1 previously shown in FIG. 3. The surface region 24 of the thermally conductive element 12 is smaller than the surface region of the electrically insulating layer 2 along a planar extent of the circuit carrier.

Figure 7:
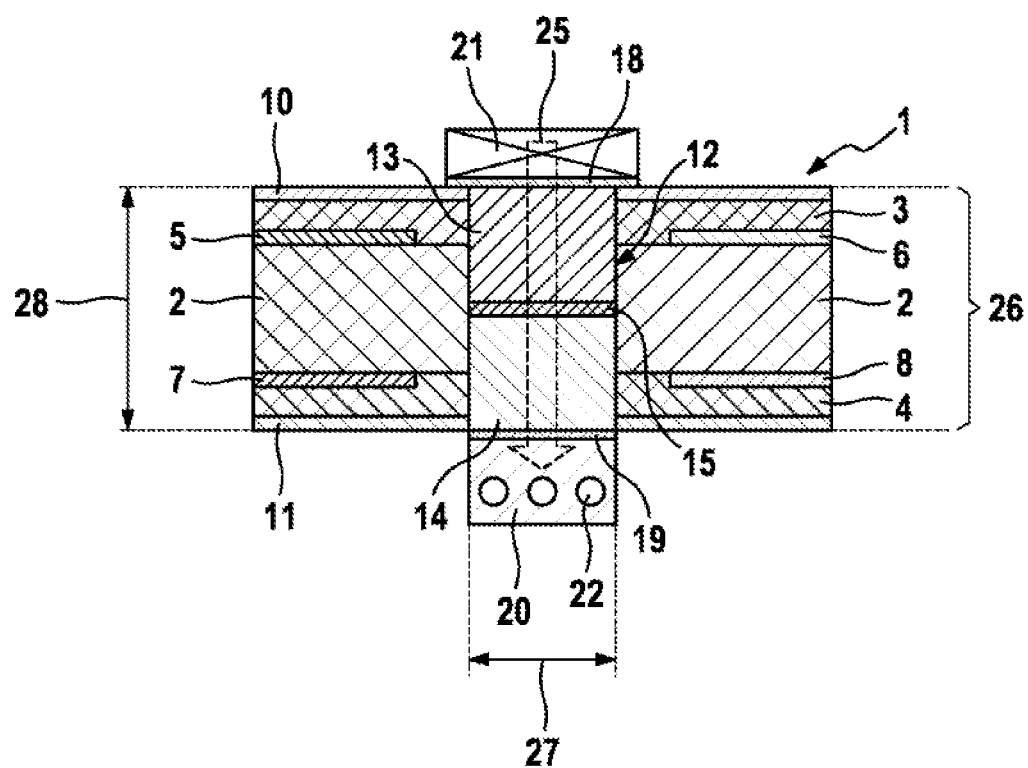
FIG. 7 shows one variant of a connecting arrangement comprising a circuit carrier, wherein the thermally conductive element extends through at least one outer electrically conductive layer and terminates with a surface of the electrically conductive layer.

FIG. 7 shows one variant of the connecting arrangement previously shown in FIG. 5. The connecting arrangement according to FIG. 7 has a circuit carrier 26 that is bonded to the semiconductor component 21 by means of a layer of solder 18 and to the cooling element 20 by means of a layer of solder 19. The circuit carrier 26 is, in the exemplary embodiment shown in FIG. 4, formed from multiple layers and comprises an inner electrically insulating layer 2, additional electrically conductive layers 5, 6, 7 and 8 that are bonded to the electrically insulating layer 2 and two additional electrically insulating layers 3 and 4 that include the electrically insulating layer 2 between them. The electrically insulating layer 3 is bonded to an electrically conductive layer 10 and the electrically insulating layer 4 is bonded to an electrically conductive layer 11. The electrically conductive layers 10 and 11 thus include the aforementioned electrically insulating layers 2, 3 and 4 and the electrically conductive layers 5, 6, 7 and 8 between them—in particular in a sandwich-like manner. In the circuit carrier 26 thus formed, a recess, an opening 27 in this exemplary embodiment, may be made by means of a punching tool 23 or a drilling tool in accordance with the method step shown in FIG. 1. The thermally conductive element 12 may then be inserted into the opening 27 in accordance with the method step shown in FIG. 2. The thermally conductive element 12 has, in the exemplary embodiment shown in FIG. 7, the same thickness-wise extent 28 as the circuit carrier 26 formed from multiple layers.

The semiconductor component 21 extends, in this exemplary embodiment, both over the sub-element 13 and over a portion of the electrically conductive layer 10. The semiconductor component 21 is thus soldered to the electrically conductive layer 10 and to the sub-element 13 by means of the layer of solder 18.

The semiconductor component 21 has, in this exemplary embodiment, an electrical terminal that is formed from a surface region of the semiconductor component 21. The surface region of the semiconductor component 21 is electrically connected to the electrically conductive layer 10 via the layer of solder 18 and connected to the sub-element 13 both electrically and in a thermally conductive manner via the layer of solder 18, so that excess heat 25 generated by the semiconductor component 21 may be transferred to the sub-element 13. The excess heat 25 may be transferred through the electrically insulating layer 15 to the sub-element 14 and from there through the layer of solder 19 to the cooling element 20. The cooling element 20 is, for example, formed from a copper cooling element or from an aluminum cooling element. The sub-elements 13 and 14 are each formed from a block of metal, for example a block of copper or of aluminum.

The invention claimed is:

1. A circuit carrier comprising at least one fiber-reinforced electrically insulating layer and at least one electrically conductive layer, wherein the circuit carrier includes at least one thermally conductive element, configured to conduct heat, that is embedded in a recess in the electrically insulating layer so as to be in contact with the electrically insulating layer, which element is configured to transport excess heat transversely to a planar extent of the circuit carrier, wherein the thermally conductive element includes at least two sub-elements that are each formed from a metal body and a connecting layer that is electrically insulating, wherein the connecting layer is positioned between the sub-elements and is configured to electrically insulate the sub-elements from one another and to connect the sub-elements to one another in a thermally conductive manner, wherein the thermally conductive element is a direct-bonded metal substrate, and wherein the sub-element is eutectically bonded to the connecting layer formed from ceramic.

2. The circuit carrier as claimed in claim 1, characterized in that both sub-elements are made of copper.

3. The circuit carrier as claimed in claim 1, characterized in that both sub-elements are made of aluminum.

4. The circuit carrier as claimed in claim 1, characterized in that one of the sub-elements is made of copper and the other of the sub-elements is made of aluminum.

5. The circuit carrier as claimed in claim 1, characterized in that the sub-elements have a greater thickness than the connecting layer.

6. The circuit carrier as claimed in claim 1, characterized in that at least one electrically conductive layer of the circuit carrier and the thermally conductive element include an additional electrically insulating layer between them, wherein the thermally conductive element is connected to the electrically conductive layer in a thermally conductive manner by at least one thermally conductive metal bridge that passes through the additional electrically insulating layer.

7. The circuit carrier as claimed in claim 6, characterized in that the metal bridge is formed from a via.

8. The circuit carrier as claimed in claim 1, characterized in that the electrically conductive layer is bonded to the electrically insulating layer by lamination.

9. The circuit carrier as claimed in claim 8, wherein the electrically insulating layer is a fiber-reinforced epoxy resin layer created from a prepreg.

10. The circuit carrier as claimed in claim 1, wherein the thermally conductive element embedded in the recess formed in the electrically insulating layer is in contact with the electrically insulating layer, and wherein the electrically insulating layer is a fiber-reinforced epoxy resin layer.

11. A connecting arrangement comprising a circuit carrier as claimed in claim 1, wherein the connecting arrangement has at least one semiconductor component connected to the electrically conductive layer and the circuit carrier is connected, in a thermally conductive manner, to a heat sink on a side of the circuit carrier that is facing away from the semiconductor component.

12. A method for guiding excess heat away from a semiconductor component to a heat sink through the circuit carrier as claimed in claim 1, wherein the excess heat is guided away from the semiconductor component to an electrically conductive layer soldered to the semiconductor component, and passes via at least one thermally conductive metal bridge through at least one electrically insulating layer and is guided to a thermally conductive element which is embedded in the at least one electrically insulating layer and which is cohesively connected to the metal bridge, and is transferred from the thermally conductive element to an additional electrically conductive layer via at least one additional metal bridge and from there to the heat sink, wherein the thermally conductive element has at least two sub-elements, each formed from a metal body and connected to one another via an electrically insulating connecting layer, wherein one sub-element is connected to the metal bridge and the other sub-element of the two sub-elements is connected to the additional metal bridge in a thermally conductive manner, so that the excess heat may flow from the semiconductor component to the heat sink through the connecting layer.

* * * * *